United States Patent
Lai et al.

(10) Patent No.: US 8,994,680 B2
(45) Date of Patent: Mar. 31, 2015

(54) SYSTEMS FOR DISPLAYING IMAGES

(75) Inventors: Szu-Wei Lai, Chu-Nan (TW); Yu-Ching Liu, Chu-Nan (TW); Wan-Yu Ho, Chu-Nan (TW)

(73) Assignees: Innocom Technology (Shenzhen) Co., Ltd., Shenzhen (CN); Innolux Corporation, Jhu-Nan (TW)

( * ) Notice: Subject to any disclaimer, the term of this patent is extended or adjusted under 35 U.S.C. 154(b) by 139 days.

(21) Appl. No.: 13/615,227

(22) Filed: Sep. 13, 2012

(65) Prior Publication Data

US 2013/0106746 A1 May 2, 2013

(30) Foreign Application Priority Data

Nov. 2, 2011 (TW) .............................. 100139911 A (51) Int. Cl.
*G06F 3/041* (2006.01)
*H05K 3/46* (2006.01)

(52) U.S. Cl.
CPC ............ *G06F 3/041* (2013.01); *Y10T 29/49162* (2013.01); *Y10T 29/49155* (2013.01); *H05K 3/4685* (2013.01); *H05K 2201/0326* (2013.01); *G06F 2203/04103* (2013.01)
USPC ......................................... 345/173; 178/18.01

(58) Field of Classification Search
USPC ..................... 345/173–179; 178/18.01–18.09; 29/846, 850
See application file for complete search history.

(56) References Cited

U.S. PATENT DOCUMENTS

| | | | |
|---|---|---|---|
| 2009/0085885 A1* | 4/2009 | Wu et al. ....................... | 345/173 |
| 2009/0213092 A1* | 8/2009 | Kuo et al. ..................... | 345/174 |
| 2009/0303195 A1* | 12/2009 | Yamato et al. ................ | 345/173 |
| 2009/0303400 A1* | 12/2009 | Hou et al. ...................... | 349/12 |
| 2010/0134429 A1* | 6/2010 | You et al. ...................... | 345/173 |
| 2010/0302206 A1* | 12/2010 | Yu et al. ........................ | 345/174 |
| 2010/0309369 A1* | 12/2010 | Jarvis et al. ................... | 348/371 |
| 2010/0321341 A1 | 12/2010 | Cho et al. | |
| 2011/0001721 A1* | 1/2011 | Chiang et al. ................. | 345/174 |
| 2011/0050625 A1* | 3/2011 | Kim et al. ..................... | 345/174 |
| 2011/0141042 A1* | 6/2011 | Kim et al. ..................... | 345/173 |
| 2011/0157071 A1 | 6/2011 | Huang et al. | |

FOREIGN PATENT DOCUMENTS

| | | |
|---|---|---|
| TW | 201036187 | 10/2010 |
| TW | 201107826 | 3/2011 |

* cited by examiner

*Primary Examiner* — Premal Patel
(74) *Attorney, Agent, or Firm* — Liu & Liu (57) ABSTRACT

A system for displaying images is provided. The system includes a touch sensor device including a transparent substrate having a sensing region and a non-sensing region adjacent to the sensing region. A sensing electrode pattern layer is on the transparent substrate in the sensing region. An inorganic dielectric material layer is on the transparent substrate. The inorganic dielectric material layer has a first portion in the non-sensing region and a second portion in the sensing region and partially covering the sensing electrode pattern layer. A method of forming a touch sensor device is also disclosed.

19 Claims, 8 Drawing Sheets

SYSTEMS FOR DISPLAYING IMAGES

CROSS REFERENCE TO RELATED APPLICATIONS

This Application claims priority of Taiwan Patent Application No. 100139911, filed on Nov. 2, 2011, the entirety of which is incorporated by reference herein.

BACKGROUND OF THE INVENTION

1. Field of the Invention

The disclosure relates to touch panel display technology, and in particular to a light shielding/decorative film for a touch sensor device.

2. Description of the Related Art

A touch sensor device is typically integrated with a flat panel display device, such as a liquid crystal display (LCD), an active matrix organic light-emitting display (AMOLED) or the like, to form a touch panel display. Touch panel displays are typically used in electronic devices, such as portable personal computers, personal digital assistants (PDAs), electronic books, projectors, mobile phones, and the like. The touch panel display is capable of conducting input functions by a finger, a stylus, a pen, or the like and therefore has gained an increasing amount of attention and popularity.

Generally, a shielding layer (e.g., a black matrix (BM) layer) is typically disposed in the peripheral region (i.e., a non-sensing region or a fan-out region) of a touch sensor device for light shielding or decoration. Currently, conventional black or white photoresist materials are used as the shielding layer. Moreover, the shielding layer are typically formed by a wet process (e.g., a screen printing or spin coating process), such that the shielding layer has a sufficient thickness (e.g., more than 1 µm) which is capable of providing a good light shielding effect. A step height, however, may be formed between the fan-out region and the sensing region due to the thick shielding layer, resulting in a mura defect between the fan-out region and the sensing region after depositing a transparent conductive layer for formation of sensing electrodes in subsequent processes, which reduces the display quality.

Accordingly, there exists a need in the art for development of a novel light shielding/decorative film structure, capable of mitigating or eliminating the aforementioned problems.

BRIEF SUMMARY OF THE INVENTION

A detailed description is given in the following embodiments with reference to the accompanying drawings. Systems for displaying images are provided. An exemplary embodiment of a system for displaying images comprises a touch sensor device comprising a transparent substrate having a sensing region and a non-sensing region adjacent to the sensing region. A sensing electrode pattern layer is on the transparent substrate in the sensing region. An inorganic dielectric material layer is on the transparent substrate. The inorganic dielectric material layer has a first portion in the non-sensing region and a second portion in the sensing region and partially covering the sensing electrode pattern layer.

An exemplary embodiment of a method of forming a touch sensor device comprises providing a transparent substrate. The transparent substrate has a sensing region and a non-sensing region adjacent to the sensing region. A sensing electrode pattern layer is formed on the transparent substrate in the sensing region. An inorganic dielectric material layer is formed on the transparent substrate, wherein the inorganic dielectric material layer has a first portion in the non-sensing region and a second portion in the sensing region and partially covering the sensing electrode pattern layer.

BRIEF DESCRIPTION OF DRAWINGS

The disclosure can be more fully understood by reading the subsequent detailed description and examples with references made to the accompanying drawings, wherein.

DETAILED DESCRIPTION OF INVENTION

The following description is of the best-contemplated mode of carrying out the disclosure. This description is provided for the purpose of illustrating the general principles of the disclosure and should not be taken in a limiting sense. The scope of the disclosure is best determined by reference to the appended claims.

Systems for displaying images are provided. Refer to FIGS. 1D and 2, in which FIG. 1D is a cross section of an embodiment of a system for displaying images including a touch sensor device 200 according to the disclosure, and FIG. 2 is a plan view of a partial structure of a sensing region in the touch sensor device 200 shown in FIG. 1D. In the embodiment, the touch sensor device 200 comprises a transparent substrate 100, a sensing electrode pattern layer 102, an inorganic dielectric material layer 104, a reflective layer 106a, a wiring layer 106b and a protective layer 120. In one embodiment, the transparent substrate 100 may be comprised of glass to serves as a sensing glass or a cover glass. In another embodiment, the transparent substrate 100 may be comprised of quartz, or other flexible or inflexible polymer transparent materials. In the embodiment, the transparent substrate 100 has a sensing region 10 and a non-sensing region 20. Typically, the sensing region 10 is located at the central region of transparent substrate 100 and the non-sensing region 20 is adjacent to the sensing region 10. In the embodiment, the non-sensing region 20 is located at the peripheral region of the transparent substrate 100 and encircles the sensing region 10.

The sensing electrode pattern layer 102 is on the transparent substrate 100 in the sensing region 10. The sensing electrode pattern layer 102 may be a transparent conductive pattern layer comprised of, for example, indium tin oxide (ITO) or indium zinc oxide (IZO), and typically comprise two sets of sensing electrodes arranged in an array. In one embodiment, the sensing electrode pattern layer 102 comprises a set of first sensing electrodes and a set of second sensing electrodes spatially insulated from and interlaced with the set of first sensing electrodes. Here, in order to simplify the diagram, only a pair of first sensing electrodes 102c and a pair of second electrodes 102a interlaced with the pair of first sensing electrodes 102c is depicted, as shown in FIG. 2. Each first sensing electrode 102c in the set of first sensing electrodes is electrically connected to each other along a first axial direction X by an electrically connecting portion 102b.

The inorganic dielectric material layer 104 is disposed on the transparent substrate 100 and corresponds to the sensing region 10 and the non-sensing region 20. For example, the inorganic dielectric material layer 104 has a first portion 104a on the transparent substrate 100 in the non-sensing region 20, to serve as a first portion of a light shielding/decorative film. Moreover, the inorganic dielectric material layer 104 has a second portion 104b on the transparent substrate 100 in the sensing region 10 and partially covering the sensing electrode pattern layer 102. For example, the second portion 104b of the inorganic dielectric material layer 104 covers the electrically connecting portion 102b of the sensing electrode pattern layer 102 along a second axial direction Y, as shown in FIG. 2.

The inorganic dielectric material layer 104 may have a thickness less than 0.3 μm. Moreover, in one embodiment, the inorganic dielectric material layer 104 may be a single layer and be comprised of silicon oxide, silicon nitride or other transparent inorganic polymer. Additionally, the inorganic dielectric material layer 104 may be a multi-layer structure (e.g., a stack of silicon oxide layers, silicon nitride layers or other transparent inorganic polymer layers or a combination thereof). In the embodiment, the thickness of the first portion 104a of the inorganic dielectric material layer 104 (i.e., the light shielding/decorative film) may be varied, such that the film appears various colors due to the light interference principle.

The reflective layer 106a is disposed on the transparent substrate 100 in the non-sensing region 20 to cover the first portion 104a of the inorganic dielectric material layer 104 and serves as a second portion of the decorative film. Moreover, the reflective layer 106a is further extended to the sensing electrode pattern layer 102 to form traces and pads for electrical connections to the sensing electrode pattern layer 102. In one embodiment, the reflective layer 106a may be a single layer (e.g., aluminum, chromium, tin, zirconium, or an alloy thereof or a combination thereof) or a multi-layer structure (e.g., a stack of aluminum layers, chromium layers, tin layers, zirconium layers, or alloy layers thereof or a combination thereof), such that the decorative film further appears metal gloss.

The wiring layer 106b is disposed on the second portion 104b of the inorganic dielectric material layer 104. As shown in FIGS. 1D and 2, each second sensing electrode 102a in the set of second sensing electrodes is electrically connected to each other along the second axial direction Y by the wiring layer 106b. The wiring layer 106b may be a single layer (e.g., aluminum, chromium, tin, zirconium, or an alloy thereof or a combination thereof) or a multi-layer structure (e.g., a stack of aluminum layers, chromium layers, tin layers, zirconium layers, or alloy layers thereof or a combination thereof). In one embodiment, the reflective layer 106a and the wiring layer 106b are formed of the same metal layer.

The protective layer 120 is disposed on the transparent substrate 100 in the sensing and non-sensing regions 10 and 20 and covers the reflective layer 106a, the sensing electrode pattern layer 102 and the wiring layer 106b. In one embodiment, the protective layer 120 may be comprised of an inorganic dielectric material and may be a single layer (e.g., a silicon oxide, silicon nitride or silicon oxynitride layer) or a multi-layer structure (e.g., a stack of silicon oxide layers, silicon nitride layers, silicon oxynitride layers or a combination thereof). In another embodiment, the protective layer 120 may be comprised of an organic photoresist material.

Figure 2:
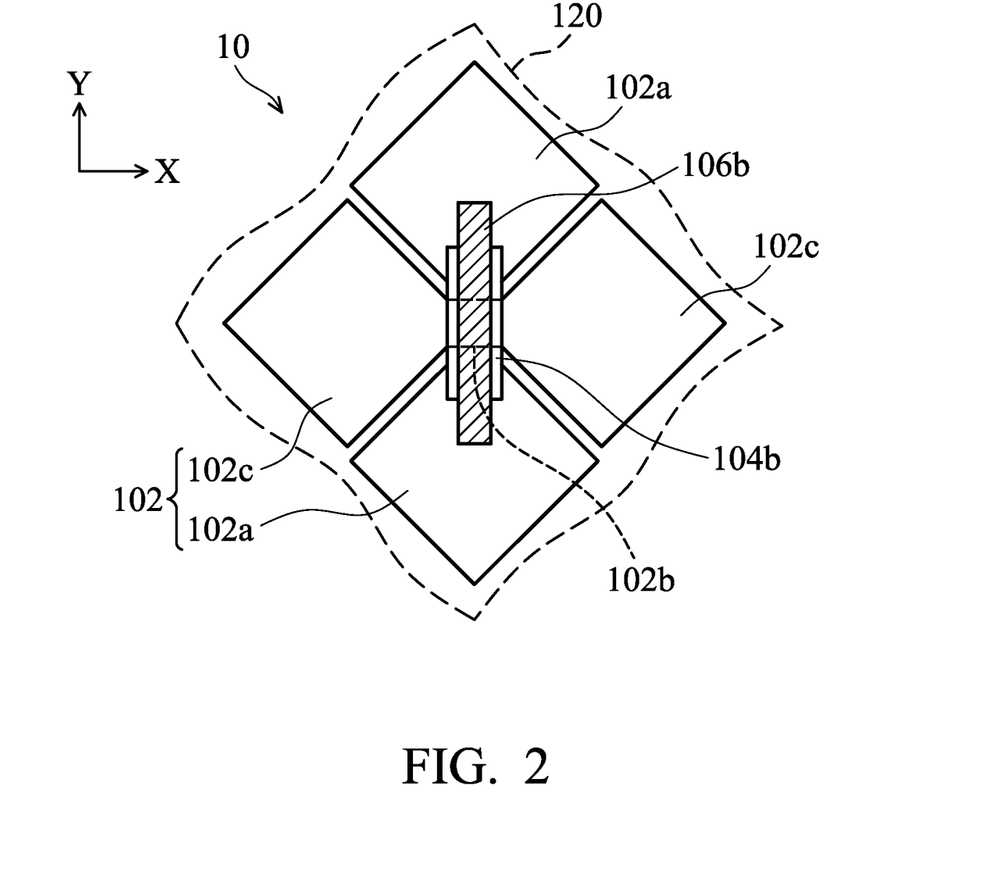
FIG. 2 is a plan view of a partial structure of a sensing region in the touch sensor device shown in FIG. 1D.
Figure 3A:
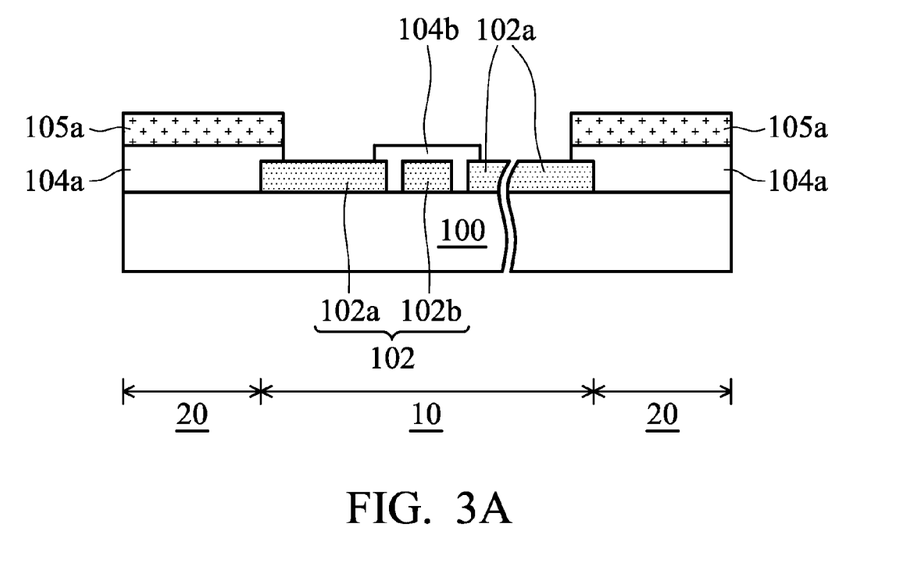
FIGS. 3A to 3C are cross sections of another embodiment of a method of forming a system for displaying images including a touch sensor device according to the disclosure.
Figure 3B:
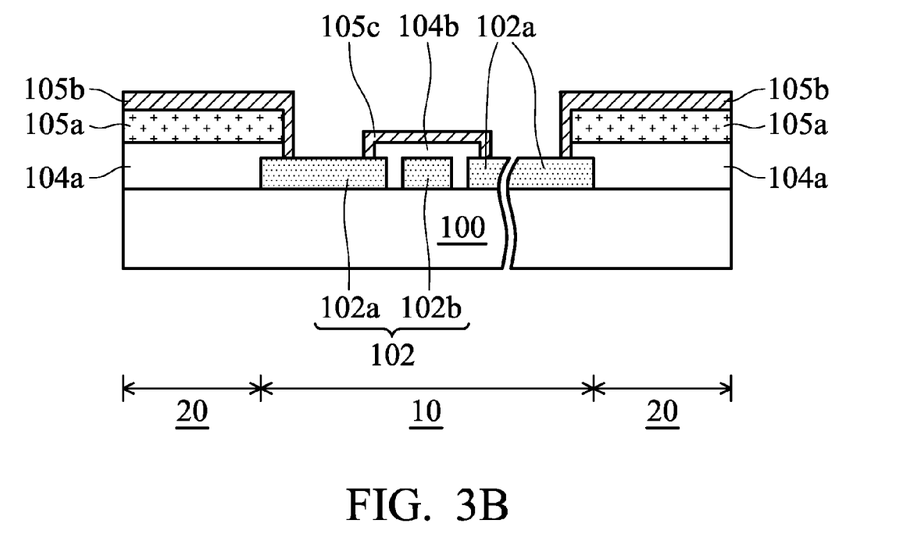
Figure 3C:
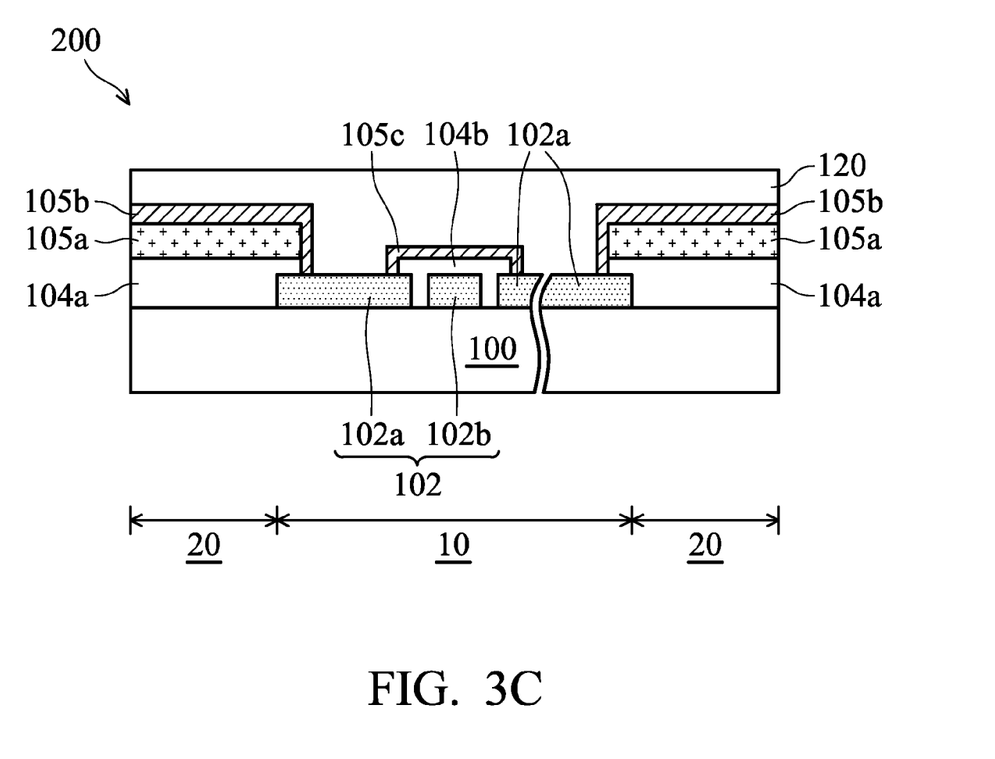

Refer to FIG. 3C, which is a cross section of another embodiment of a system for displaying images including a touch sensor device 200 according to the disclosure. Elements in FIG. 3C that are the same as those in FIG. 1D are labeled with the same reference numbers as in FIG. 1D and are not described again for brevity. Unlike the embodiment of FIG. 1D, the touch sensor device 200 of the embodiment comprises a non-conductive reflective layer 105a and a metal layer 105b. The non-conductive reflective layer 105a may be comprised of a dielectric material with high reflectivity, such as ink (e.g., silver or white ink), a discontinuous phase of metal or a photoresist (e.g., silver or white photoresist). Moreover, the metal layer 105b is disposed on the non-conductive reflective layer 105a and extended to the sensing electrode pattern layer 102 to form traces and pads for electrical connections to the sensing electrode pattern layer 102. In one embodiment, the metal layer 105b and a wiring layer 105c are formed of the same material layer and may be a single layer (e.g., aluminum, chromium, tin, zirconium, or an alloy thereof or a combination thereof) or a multi-layer structure (e.g., a stack of aluminum layers, chromium layers, tin layers, zirconium layers, or alloy layers thereof or a combination thereof). Each second sensing electrode 102a in the set of second sensing electrodes is also electrically connected to each other along the second axial direction Y by the wiring layer 105c as well as the wiring layer 106b (shown in FIG. 2).

Figure 4A:
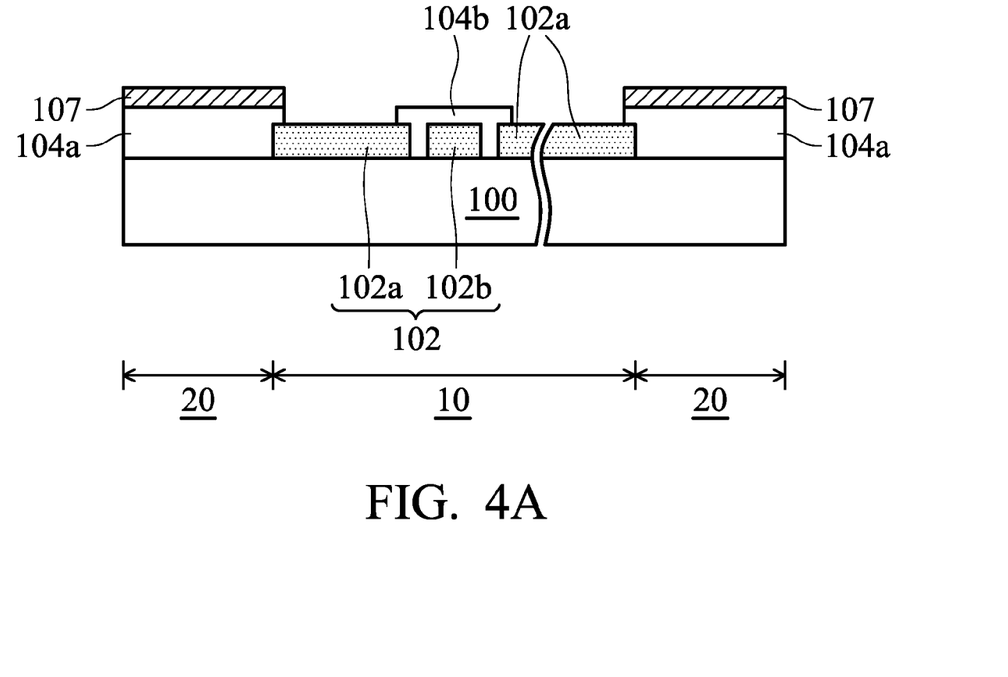
FIGS. 4A to 4D are cross sections of yet another embodiment of a method of forming a system for displaying images including a touch sensor device according to the disclosure.
Figure 4B:
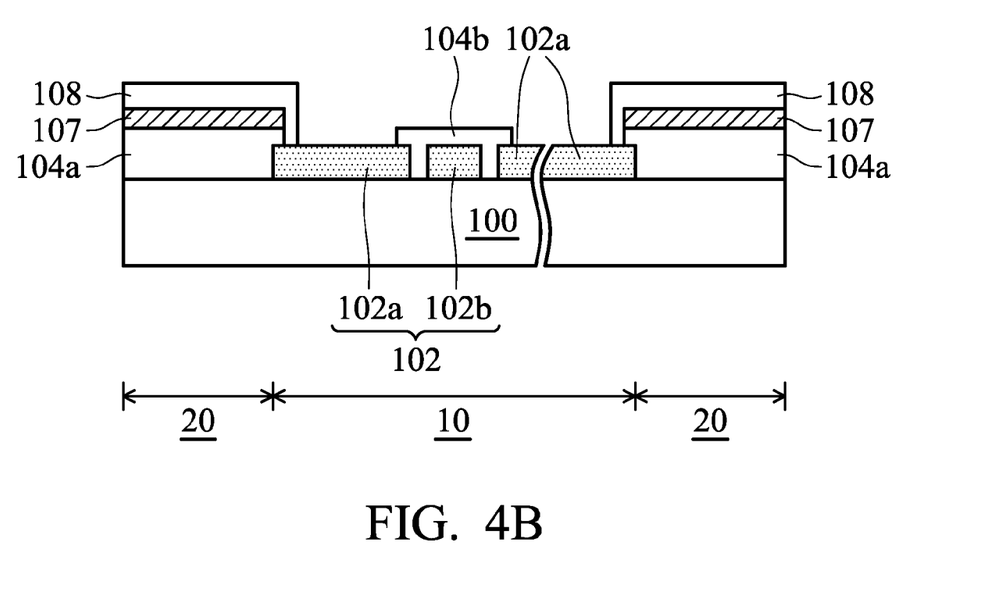
Figure 4C:
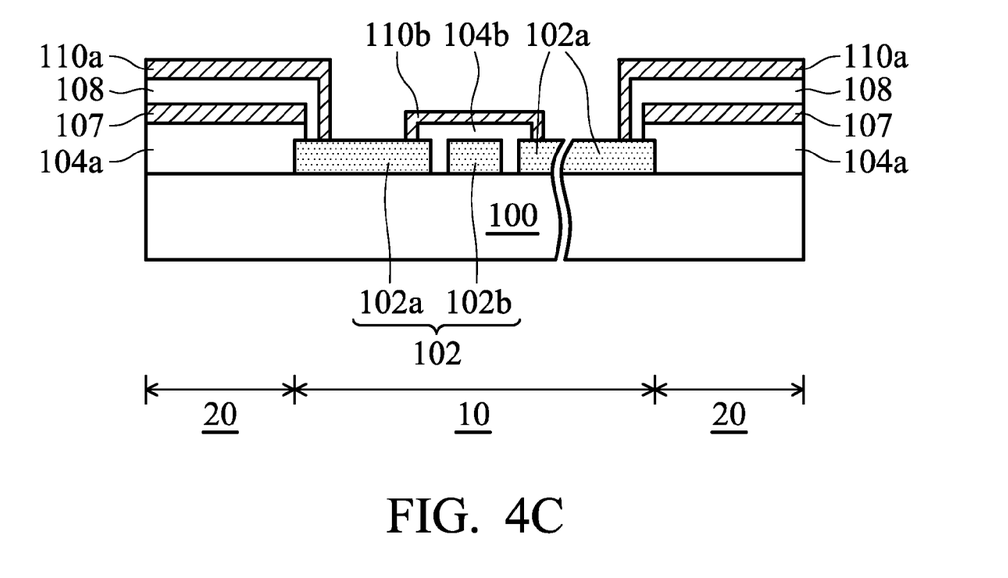
Figure 4D:
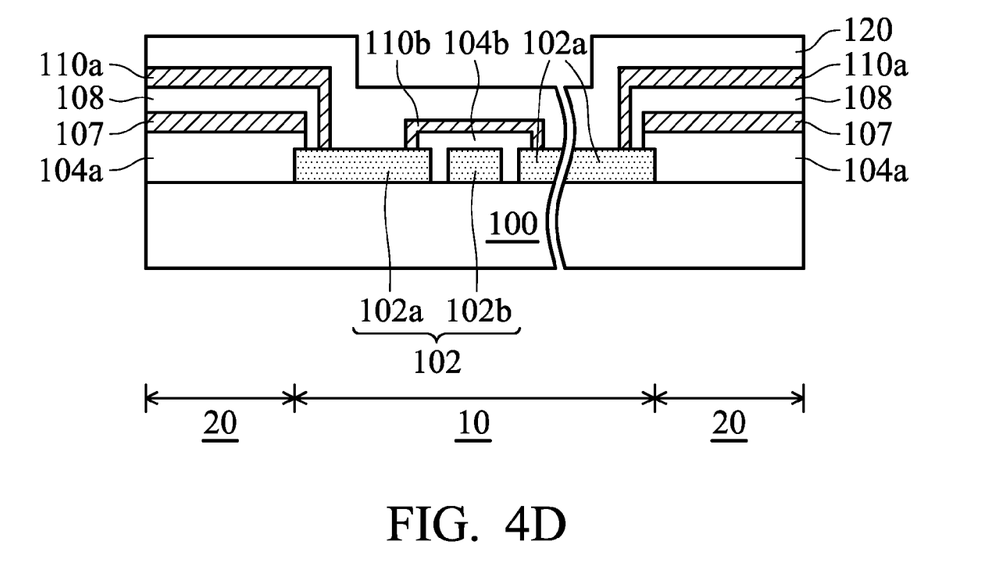

Refer to FIG. 4D, which is a cross section of yet another embodiment of a system for displaying images including a touch sensor device 200 according to the disclosure. Elements in FIG. 4D that are the same as those in FIG. 1D or 3C are labeled with the same reference numbers as in FIG. 1D or 3C and are not described again for brevity. The touch sensor device 200 of the embodiment, which is similar to that of the embodiment of FIG. 1D, may comprise a transparent substrate 100, a sensing electrode pattern layer 102, an inorganic dielectric material layer 104 and a protective layer 120. Moreover, the touch sensor device 200 of the embodiment may further comprise a first metal layer 107, a second metal layer 110a, an isolation layer 108 and a wiring layer 110b. The first metal layer 107 is disposed on the transparent substrate 100 in the non-sensing region 20 to cover the first portion 104a of the inorganic dielectric material 104 and serves as a reflective layer, wherein the first metal layer 107 may be comprised of the same material as that of the reflective layer 106a shown in FIG. 1D. In one embodiment, the first metal layer 107 may be a single layer or a multi-layer structure that is comprised of a non-conductive discontinuous phase of metal, such as aluminum, chromium, tin, zirconium, or an alloy thereof or a combination thereof.

The second metal layer 110a, which may be comprised of the same material as that of the metal layer 105b shown in FIG. 3C, is disposed on the first metal layer 107 and extended to the sensing electrode pattern layer 102 to form traces and pads for electrical connections to the sensing electrode pattern layer 102.

The isolation layer 108 is interposed between the first metal layer 107 and the second metal layer 110a and extended to the sidewalls of the first metal layer 107 and the underlying inorganic dielectric material layer 104, such that the first metal layer 107 is electrically insulated from the second metal layer 110a. In one embodiment, the isolation layer 108 may be comprised of the same material as that of the inorganic dielectric material layer 104 or the protective layer 120.

The wiring layer 110b is disposed on the second portion 104b of the inorganic dielectric material layer 104, such that the protective layer 120 covers the second metal layer 110a, the sensing electrode pattern layer 102 and the wiring layer 110b. Additionally, each second sensing electrode 102a in the set of second sensing electrodes is also electrically connected to each other along the second axial direction Y by the wiring layer 110b as well as the wiring layer 106b (shown in FIG. 2). In one embodiment, the wiring layer 110b and the second metal layer 110a are formed of the same material layer.

Figure 1A:
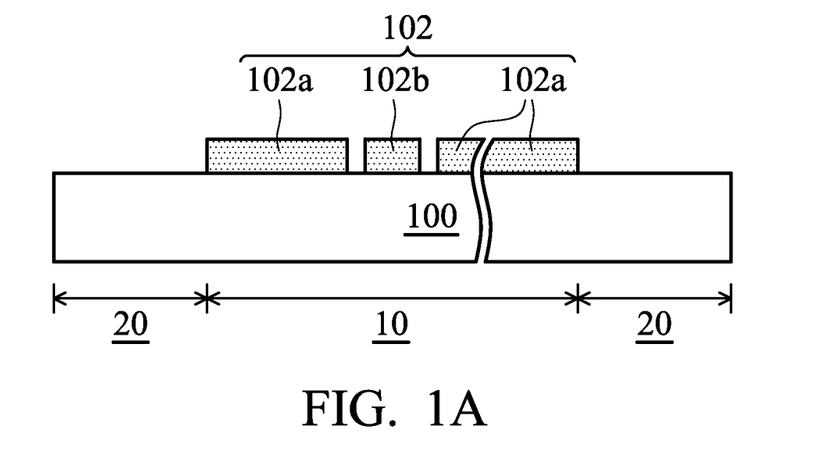
FIGS. 1A to 1D are cross sections of an embodiment of a method of forming a system for displaying images including a touch sensor device according to the disclosure.
Figure 1B:
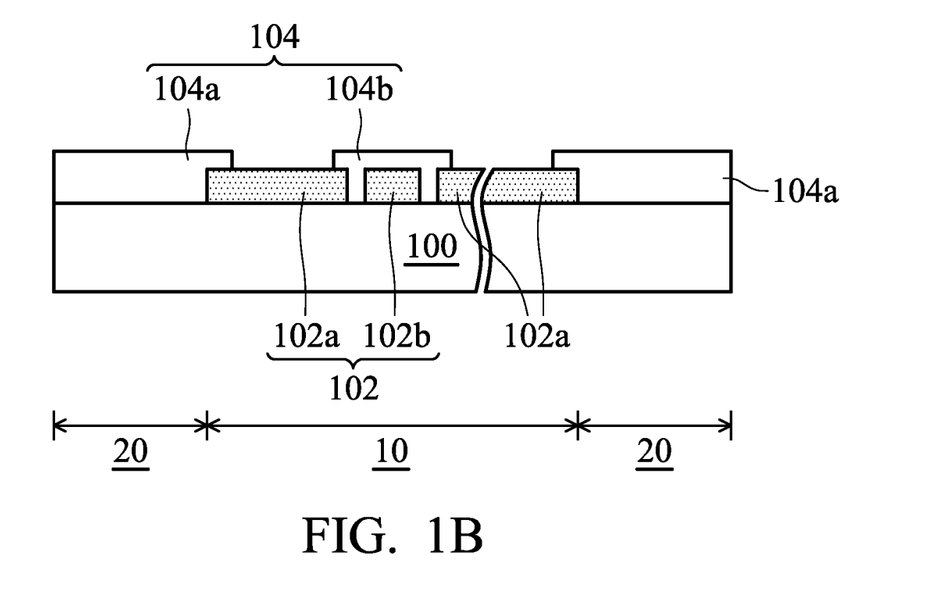
Figure 1C:
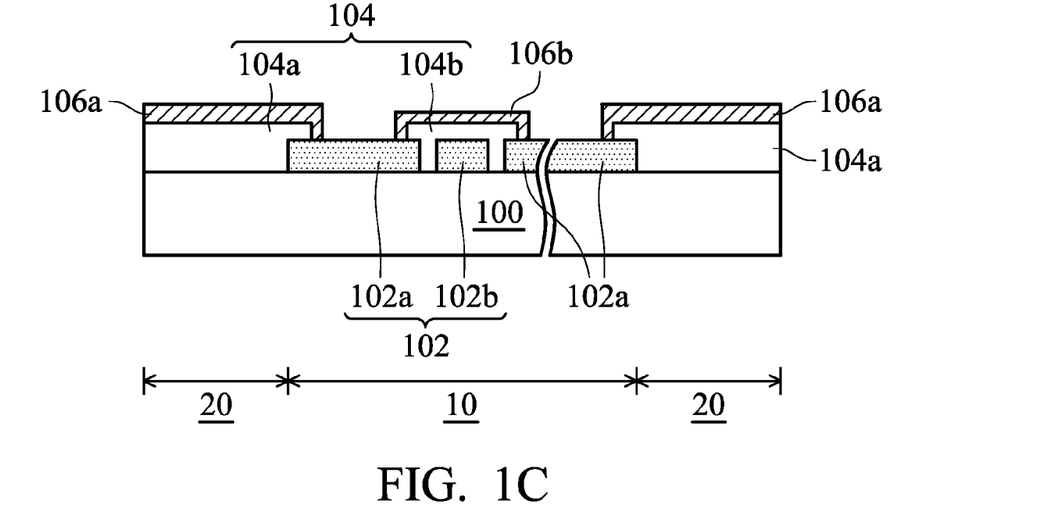
Figure 1D:
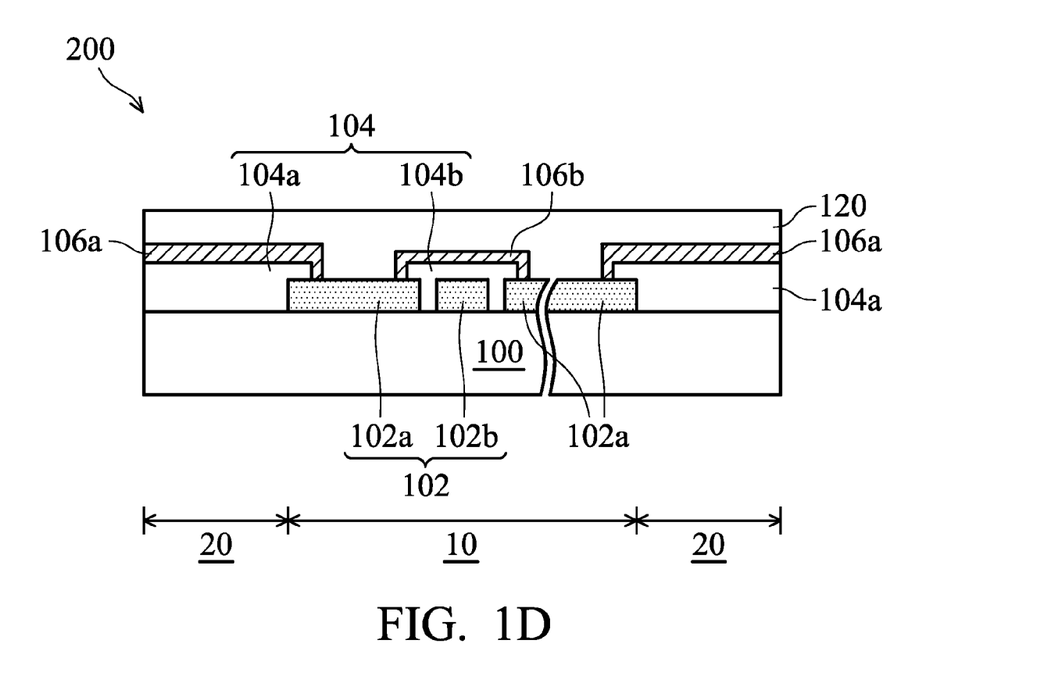

FIGS. 1A to 1D are cross sections of an embodiment of a method of forming a system for displaying images including a touch sensor device according to the disclosure. Referring to FIG. 1A, a transparent substrate 100, which has a sensing region 10 and a non-sensing region 20 adjacent thereto, is provided. Next, a sensing electrode pattern layer 102, such as an ITO or IZO pattern layer, is formed on the transparent substrate 100. The sensing electrode pattern layer 102 comprises a set of first sensing electrodes, a set of second sensing electrodes spatially insulated from and interlaced with the set of first sensing electrodes, and an electrically connecting portion 102b. Here, in order to simplify the diagram, only a pair of first sensing electrode 102c (as shown in FIG. 2) and a pair of second sensing electrodes 102a (as shown in FIGS. 1A and 2) spatially insulated from and interlaced with the pair of first sensing electrode 102c are depicted. Each first sensing electrode 102c in the set of first sensing electrodes is electrically connected to each other along a first axial direction X by the electrically connecting portion 102b, as shown in FIG. 2.

Referring to FIG. 1B, an inorganic dielectric material layer 104 is formed on the transparent substrate 100 by a conventional deposition process, such as chemical vapor deposition (CVD) process. Thereafter, the inorganic dielectric material layer 104 is patterned by conventional lithography and etching processes, such that the inorganic dielectric material layer 104 has a first portion 104a on the transparent substrate 100 in the non-sensing region 20 and a second portion 104b on the transparent substrate 100 in the sensing region 10 and partially covering the sensing electrode pattern layer 102. The first portion 104a serves as a first portion of a light shielding/decorative film, and the second portion 104b covers the electrically connecting portion 102b of the sensing electrode pattern layer 102 along a second axial direction Y, as shown in FIG. 2.

Referring to FIG. 1C, a conductive layer (not shown) is formed on the transparent substrate 100 by a conventional deposition process (e.g., CVD), to cover the inorganic dielectric material layer 104 and the sensing electrode pattern layer 102 shown in FIG. 1B. Thereafter, the conductive layer is patterned by conventional lithography and etching processes, to form a reflective layer 106a on the transparent substrate 100 in the non-sensing region 20, thereby covering the first portion 104a of the inorganic dielectric material layer 104, and form a wiring layer 106b on the second portion 104b of the inorganic dielectric material layer 104 in the sensing region 10. The reflective layer 106a is extended to the sensing electrode pattern layer 102 to form traces and pads for electrical connections to the sensing electrode pattern layer 102. Moreover, the wiring layer 106b is also extended to the sensing electrode pattern layer 102, such that the adjacent second sensing electrodes 102a in the set of second sensing electrodes are electrically connected to each other along the second axial direction Y by the wiring layer 106b, as shown in FIG. 2.

Referring to FIG. 1D, a protective layer 120 is formed on the structure shown in FIG. 1C by a conventional deposition process (e.g., CVD), to cover the reflective layer 106a, the sensing electrode pattern layer 102, and the wiring layer 106b.

FIGS. 3A to 3C are cross sections of another embodiment of a method of forming a system for displaying images including a touch sensor device according to the disclosure. Elements in FIGS. 3A to 3C that are the same as those in FIGS. 1A to 1D are labeled with the same reference numbers as in FIGS. 1A to 1D and are not described again for brevity. Referring to FIG. 3A, a transparent substrate 100 having a sensing electrode pattern layer 102 and an inorganic dielectric material layer 104 thereon is provided, which is the same as the structure shown in FIG. 1B. Next, a non-conductive reflective layer 105a, which is a dielectric layer with high reflectivity, such as ink (e.g., silver or white ink), a discontinuous phase of metal or a photoresist (e.g., silver or white photoresist), is formed on the first portion 104a of the inorganic dielectric material layer 104.

Referring to FIG. 3B, a metal layer 105b is formed on the non-conductive reflective layer 105a in the non-sensing region 20 by conventional deposition (e.g., CVD), lithography and etching processes, to enhance the reflective ability. At the same time, a wiring layer 105c is formed on the second portion 104b of the inorganic dielectric material layer 104 in the sensing region 10, and is extended to the sensing electrode pattern layer 102 through the sidewall of the second portion 104b of the inorganic dielectric material layer 104. The metal layer 105b may be further extended to the sensing electrode pattern layer 102 through sidewalls of the non-conductive reflective layer 105a and the underlying first portion 104a of the inorganic dielectric material layer 104.

Referring to FIG. 3C, a protective layer 120 is formed on the structure shown in FIG. 3B by a conventional deposition process (e.g., CVD), to cover the metal layer 105b, the sensing electrode pattern layer 102 and the wiring layer 105c.

FIGS. 4A to 4D are cross sections of yet another embodiment of a method of forming a system for displaying images including a touch sensor device according to the disclosure. Elements in FIGS. FIGS. 4A to 4D that are the same as those in FIGS. 1A to 1D are labeled with the same reference numbers as in FIGS. 1A to 1D and are not described again for brevity. Referring to FIG. 4A, a transparent substrate 100 having a sensing electrode pattern layer 102 and an inorganic dielectric material layer 104 thereon is provided, which is the same as the structure shown in FIG. 1B. Next, a first metal layer 107 is formed on the transparent substrate 100 in the non-sensing region 20 by conventional deposition (e.g., CVD), lithography and etching processes, to cover the first portion 104a of the inorganic dielectric material layer 104 and serve as a reflective layer. In some embodiments, a non-conductive discontinuous phase of metal layer is formed in the non-sensing region 20 by non-conductive vacuum metallization (NCVM), to be instead of the first metal layer 107.

Referring to FIG. 4B, an isolation layer 108 is formed on the first metal layer 107 in the non-sensing region 20 by conventional deposition (e.g., CVD), lithography and etching processes. The isolation layer 108 may be extended to the sensing electrode pattern layer 102 through sidewalls of the first metal layer 107 and the underlying first portion 104a of the inorganic dielectric material layer 104.

Referring to FIG. 4C, a second metal layer 110a is formed on the isolation layer 108 by conventional deposition (e.g., CVD), lithography and etching processes. At the same time, a wiring layer 110b is formed on the second portion 104b of the inorganic dielectric material layer 104 and extended to the sensing electrode pattern layer 102 through the sidewall of the second portion 104b of the inorganic dielectric material layer 104. The second metal layer 110a may be further extended to the sensing electrode pattern layer 102 through the sidewall of the isolation layer 108. In this case, the second metal layer 110a is electrically insulated from the first metal layer 107 by the isolation layer 108.

Referring to FIG. 4D, a protective layer 120 is formed on the structure shown in FIG. 4C by a conventional deposition process (e.g., CVD), to cover the second metal layer 110*a*, the sensing electrode pattern layer 102, and the wiring layer 110*b*.

According to the aforementioned embodiments, since the sensing electrodes are formed prior to the formation of the light shielding/decorative film, a step height is not formed between the non-sensing region and the sensing region. Namely, mura defects can be eliminated, thereby increasing the display quality. Moreover, the light shielding/decorative film can have desired colors by adjusting the thickness of the inorganic dielectric material layer in the light shielding/decorative film and can appear metal gloss or enhance the reflective ability by the reflective layer. Accordingly, compared to the conventional light shielding/decorative film formed of photoresist material, the light shielding/decorative film according to the embodiments can provide more color choices for users. Moreover, since the inorganic dielectric material layer, the reflective layer, and the protective layer in the light shielding/decorative film can be formed during fabrication of the components in the sensing region of the touch sensor device, the fabrication of the light shielding/decorative film can be easily integrated with the fabrication of the touch sensor device, thereby simplifying processes.

Figure 5:
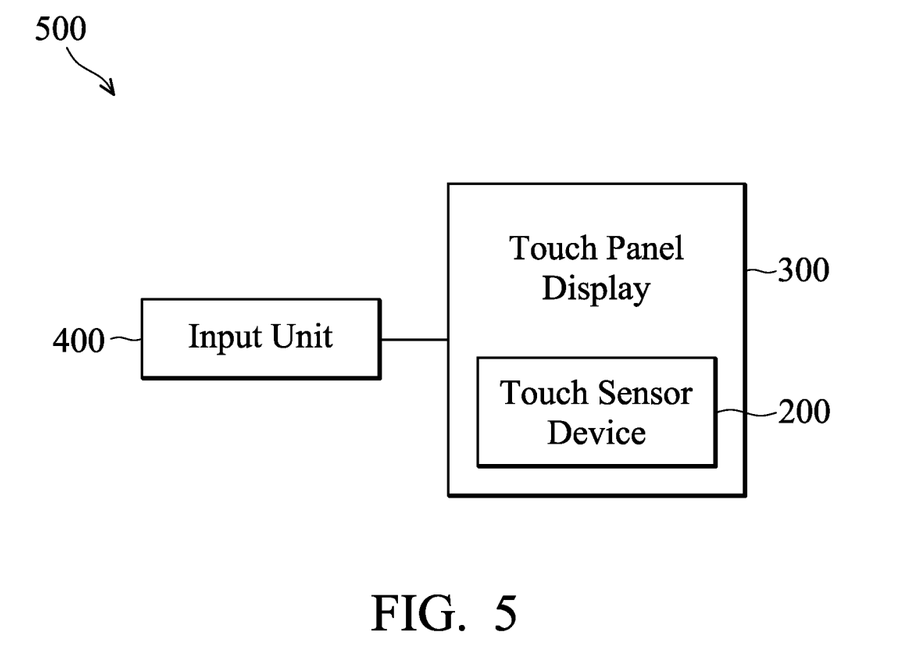
FIG. 5 schematically shows another embodiment of a system for displaying images.

FIG. 5 schematically shows another embodiment of a system for displaying images which, in this case, is implemented as a touch panel display 300 or an electronic device 500 such as a tablet personal computer, a projector, an electronic book, a laptop computer, a mobile phone, a digital camera, a personal digital assistant (PDA), a desktop computer, a television, a car display or a portable DVD player. The described touch sensor device 200 can be incorporated into the touch panel display 300. In some embodiments, the touch sensor device 200 can be incorporated into the electronic device 500. As shown in FIG. 5, the electronic device 500 comprises the touch panel display 300 and an input unit 400. Moreover, the input unit 400 is coupled to the touch panel display 300 and is operative to provide input signals (e.g. image signals) to the touch panel display 300 to generate images.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
a touch sensor device, comprising:
a transparent substrate having a sensing region and a non-sensing region adjacent to the sensing region;
a sensing electrode pattern layer on the transparent substrate in the sensing region;
an inorganic dielectric material layer having a first portion on the transparent substrate in the non-sensing region and a second portion in the sensing region, wherein the second portion partially covers the sensing electrode pattern layer; and
a reflective layer disposed on the transparent substrate in the non-sensing region and covering the first portion of the inorganic dielectric material layer.

2. The system of claim 1, wherein the sensing electrode pattern layer comprises:
a set of first sensing electrodes and a set of second sensing electrodes spatially insulated from and interlaced with the set of first sensing electrodes; and
an electrically connecting portion electrically connected to the set of first sensing electrodes along a first axial direction,
wherein the inorganic dielectric material layer covers the electrically connecting portion along a second axial direction.

3. The system of claim 2, wherein the touch sensor device further comprises
a wiring layer disposed on the second portion of the inorganic dielectric material layer and electrically connected to the set of second sensing electrodes along the second axial direction.

4. The system of claim 3, wherein the reflective layer is extended to the sensing electrode pattern layer and is formed of the same material layer with the wiring layer.

5. The system of claim 3, wherein the reflective layer is a non-conductive reflective layer.

6. The system of claim 5, wherein the non-conductive reflective layer comprises a material selected from ink, photoresist, or a discontinuous phase of metal.

7. The system of claim 3, wherein the touch sensor device further comprises a metal layer disposed on the transparent substrate in the non-sensing region to cover the reflective layer.

8. The system of claim 7, wherein the metal layer is extended to the sensing electrode pattern layer and is formed of the same material layer with the wiring layer.

9. The system of claim 8, wherein the touch sensor device further comprises a protective layer covering the metal layer, the sensing electrode pattern layer, and the wiring layer.

10. The system of claim 1, further comprising a touch panel display, wherein the touch panel display comprises the touch sensor device.

11. The system of claim 10, further comprising an electronic device having the touch panel display, wherein the electronic device comprises a tablet personal computer, a projector, an electronic book, a laptop computer, a mobile phone, a digital camera, a personal digital assistant, a desktop computer, a television, a car display or a portable DVD player.

12. A method of manufacturing a touch sensor device, comprising:
providing a transparent substrate, having a sensing region and a non-sensing region adjacent to the sensing region;
forming a sensing electrode pattern layer on the transparent substrate in the sensing region;
forming an inorganic dielectric material, having a first portion layer on the transparent substrate in the non-sensing region and a second portion in the sensing region, wherein the second portion partially covers the sensing electrode pattern layer, and
forming a reflective layer on the transparent substrate in the non-sensing region to cover the first portion of the inorganic dielectric material layer.

13. The method of claim 12, wherein the sensing electrode pattern layer comprises:
a set of first sensing electrodes and a set of second sensing electrodes spatially insulated from and interlaced with the set of first sensing electrodes; and
an electrically connecting portion electrically connected to the set of first sensing electrodes along a first axial direction,
wherein the inorganic dielectric material layer covers the electrically connecting portion along a second axial direction.

14. The method of claim 13, further comprising:
forming a wiring layer on the second portion of the inorganic dielectric material layer, such that the wiring layer is electrically connected to the set of second sensing electrodes along the second axial direction.

15. The method of claim 14, wherein the reflective layer is extended to the sensing electrode pattern layer and is formed of the same material layer with the wiring layer.

16. The method of claim 14, wherein the reflective layer is a non-conductive reflective layer.

17. The method of claim 14, further comprising forming a metal layer on the transparent substrate in the non-sensing region to cover the reflective layer.

18. The method of claim 17, wherein the metal layer is extended to the sensing electrode pattern layer and is formed of the same material layer with the wiring layer.

19. The method of claim 18, further comprising forming a protective layer to cover the metal layer, the sensing electrode pattern layer, and the wiring layer.

\* \* \* \* \*